United States Patent [19]
Sato et al.

[11] Patent Number: 5,633,480
[45] Date of Patent: May 27, 1997

[54] PRINTED WIRING BOARD HAVING A COVER LAY LAMINATED ON A POLYIMIDE RESIN BASE FILM CONTAINING CONDUCTIVE CIRCUITS

[75] Inventors: Hiromoto Sato; Junzaburo Shirai, both of Saitama, Japan

[73] Assignee: CMK Corporation, Saitama, Japan

[21] Appl. No.: 539,336

[22] Filed: Oct. 4, 1995

[30] Foreign Application Priority Data

Oct. 4, 1994 [JP] Japan .................................. 6-264653

[51] Int. Cl.[6] .................................................. H05K 1/02
[52] U.S. Cl. ................................. 174/255; 174/254
[58] Field of Search ............................ 174/250, 255, 174/254, 262; 361/749; 439/67, 77

[56] References Cited

U.S. PATENT DOCUMENTS

| | | | |
|---|---|---|---|
| 4,800,461 | 1/1989 | Dixon et al. ........................... | 361/398 |
| 5,045,642 | 9/1991 | Ohta et al. ............................. | 174/266 |
| 5,095,628 | 3/1992 | McKenney et al. .................... | 29/846 |
| 5,262,594 | 11/1993 | Edwin et al. .......................... | 174/254 |
| 5,499,444 | 3/1996 | Doane, Jr. et al. .................... | 29/830 |

*Primary Examiner*—Laura Thomas
*Attorney, Agent, or Firm*—Oblon, Spivak, McClelland, Maier & Neustadt, P.C.

[57] ABSTRACT

Conductive circuits (copper foil) are provided on both surfaces of a basefilm. A first prepreg is laminated onto both surfaces of the basefilm. A cover lay is provided at an opening portion of the basefilm. The cover lay may extend to a through-hole. The semirigid cover lay, made from polyimide-containing resin material, is placed to cover the opening portion, thermocompressed, and bonded to be laminated onto the surface of the basefilm. A second prepreg having an opening portion whose shape is substantially similar to the opening portion of the first prepreg, is laminated on the first prepreg.

11 Claims, 3 Drawing Sheets

2

PRINTED WIRING BOARD HAVING A COVER LAY LAMINATED ON A POLYIMIDE RESIN BASE FILM CONTAINING CONDUCTIVE CIRCUITS

BACKGROUND OF THE INVENTION

1. Field of the Invention

The present invention relates to a printed wiring board, and in particular, to improvement of a cover lay which is laminated on a surface of a polyimide resin basefilm on which conductive circuits made from copper foil are formed.

2. Description of the Related Art

In a conventional cover lay which is used for a printed wiring board, the cover lay is made by applying an adhesive such as epoxy resin, acrylic resin, etc., to a surface of a sheet made from polyimide resin. The printed wiring board on which such a cover lay is laminated has flexibility. A rigid flex printed wiring board is made by laminating rigid board both surfaces of which are covered with conductive circuits onto some parts of the printed wiring board which has flexibility.

Namely, in a conventional rigid flex printed wiring board, a surface of the flex part is covered with cover lay made from polyimide resin which has adhesive applied thereto. However, a part of the cover lay can easily exfoliate from the bonding layer made from epoxy resin and can blister, since cover lay made from polyimide resin has hygroscopicity. Accordingly, such a conventional rigid flex printed wiring board would have an inferior appearance and would be disadvantageous. Further, the possibility of losing electric characteristics occurs, because water can enter the portion at which the cover lay exfoliates from the bonding layer.

SUMMARY OF THE INVENTION

The object of the present invention is to provide a printed wiring board in which the cover lay never exfoliates from the surface of the flexible portion.

Note that in this specification, the polyimide-containing resin material may not be pure polyimide resin, but may include other materials, such as epoxy resin, for example.

The printed wiring board according to the present invention comprises a basefilm whose surfaces are provided with conductive circuits, and cover lays laminated onto surfaces of the basefilm, made from a single layer sheet of semirigid polyimide-containing resin material which is placed on surfaces of the basefilm and thermocompressed and bonded thereto.

Further, the printed wiring board according to the present invention comprises a basefilm whose surfaces are provided with conductive circuits, a first prepreg with an opening portion, and a cover lay laminated onto the upper surface thereof. The cover lay, made from a single layer sheet of semirigid polyimide-containing resin material, is placed on the first prepreg in such a manner that the opening portion of the prepreg is overlapped and the cover lay is thermocompressed and bonded thereto. Then, a second prepreg is laminated onto the first prepreg, the second prepreg having an opening portion whose shape is substantially similar to the opening portion of the first prepreg and which is placed in such a manner that the opening portions of the first prepreg and the second prepreg overlap each other. Similarly, another first prepreg, another cover lay and another second prepreg are arranged on the lower surface of the basefilm.

Furthermore, the printed wiring board according to the present invention comprises a basefilm whose surfaces are provided with conductive circuits, and cover lays are laminated onto surfaces thereof which are made from a single layer sheet of semirigid polyimide-containing resin material which are thermocompressed and bonded thereto. The prepregs, which have smaller opening portions than the cover lays, are laminated onto surfaces of the basefilm in such a manner that the opening portions are overlapped with the cover lays.

BRIEF DESCRIPTION OF THE DRAWINGS

The present invention will be better understood from the description of the preferred embodiments of the invention set forth below, together with the accompanying drawings, in which.

DESCRIPTION OF PREFERRED EMBODIMENTS

Note that in this specification, the polyimide-containing resin material may not be pure polyimide resin, but may include other materials, such as epoxy resin, for example.

Figure 1:
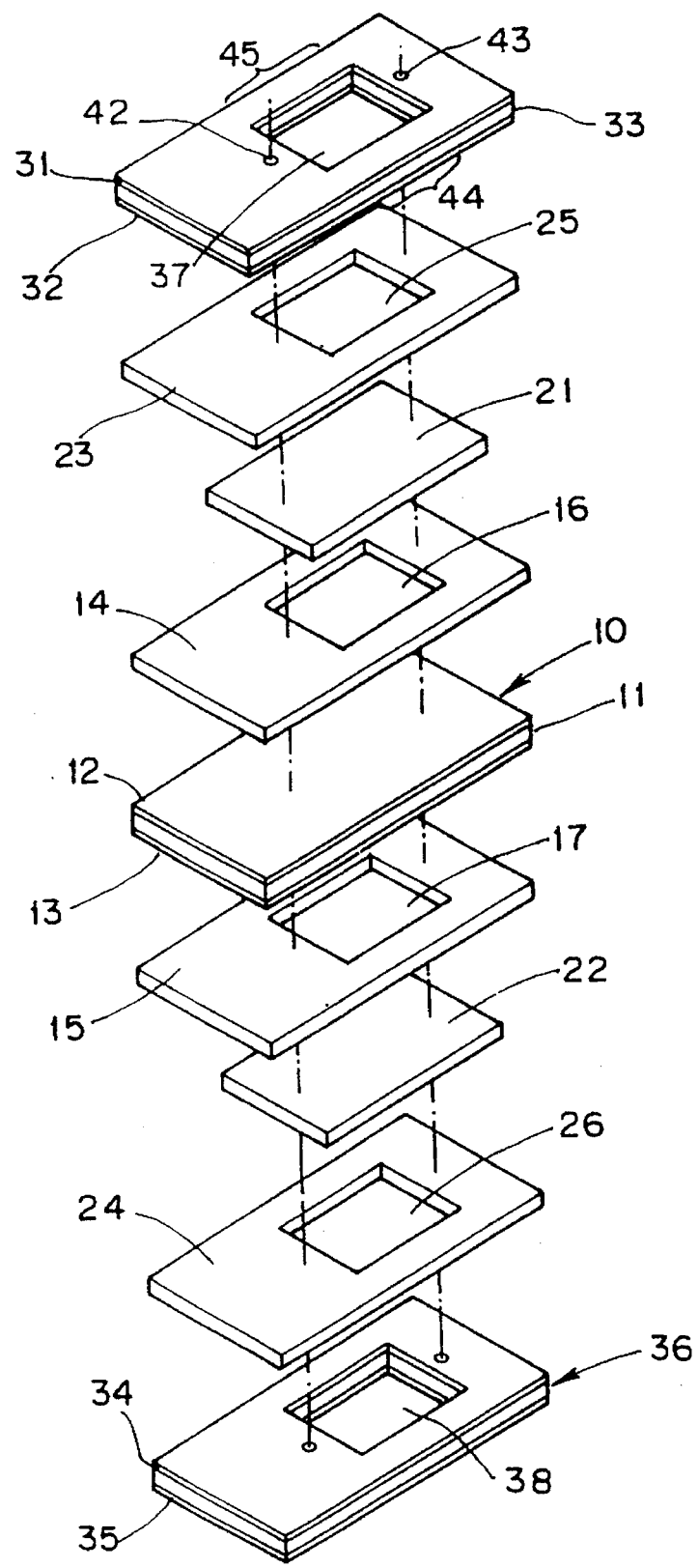
FIG. 1 is an exploded perspective view showing a first embodiment according to the present invention.
Figure 2:
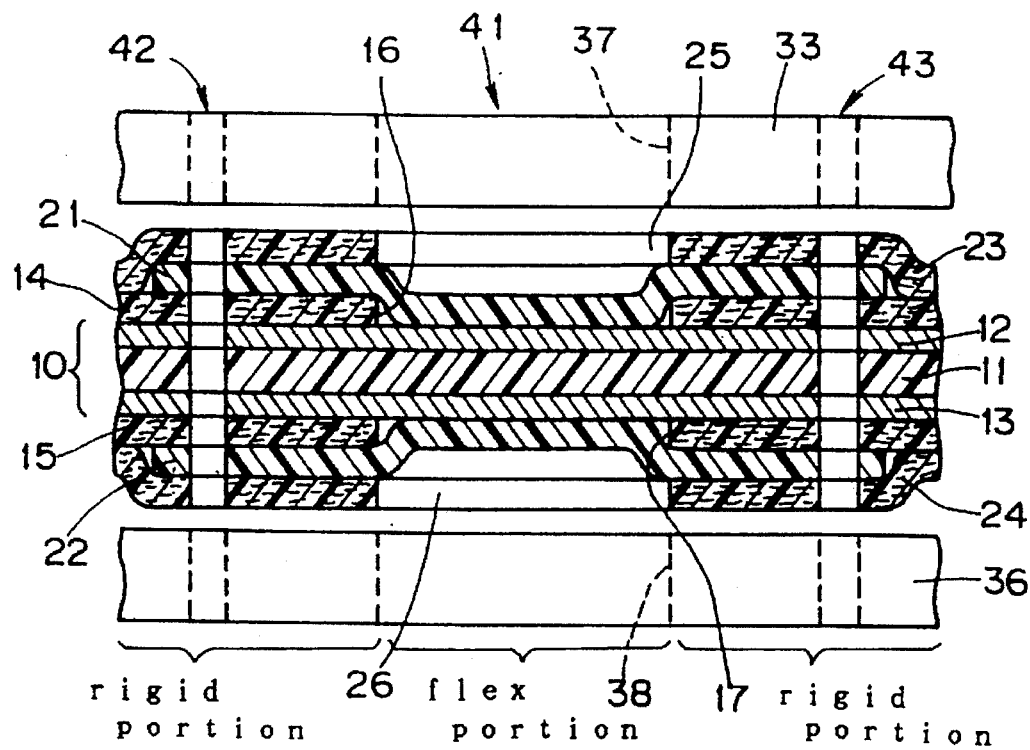
FIG. 2 is a sectional view showing a structure of laminated layers of the printed wiring board described in FIG. 1.

The present invention will be now described with reference to the accompanying drawings wherein, FIG. 1 is an exploded perspective view of the printed wiring board according to the first embodiment, and FIG. 2 is a sectional view which shows the structure of laminated layers.

A basefilm 10 is made by laminating copper foil sheets 12, 13 onto both sides of a sheet 11 made from polyimide-containing resin material. Conductive circuits are made by etching the copper foil sheets 12, 13. First prepregs 14, 15 are made by saturating a glass fiber sheet with epoxy resin. The first prepreg 14 is laminated onto the upper side of the basefilm 10, and the first prepreg 15 is laminated onto the lower side of the basefilm 10. The prepreg 14 has an opening portion 16 and the prepreg 15 has an opening portion 17. The opening portions 16, 17 overlap each other.

The opening portion 16 is covered by a cover lay 21 made from polyimide-containing resin material, and the opening portion 17 is covered by a cover lay 22 made from polyimide-containing resin material. The cover lay 21 is large enough to cover the opening portion 16. As described below, the cover lay 21 is placed on the surface of the basefilm 10 in such a way that the opening portion 16 is covered by the cover lay 21, in a semirigid condition, and thermocompressed to be bonded onto the surface of the basefilm 10. The cover lay 22 has a construction similar to the cover lay 21.

A second prepreg 23 is laminated onto the opposite side of the first prepreg 14 whose one side is attached to the basefilm 10. A second prepreg 24 is laminated on the opposite side of the first prepreg 15 whose one side is attached to the basefilm 10. The second prepregs 23, 24 are made by saturating a glass fiber sheet with epoxy resin like the first prepregs 14, 15. The second prepreg 23 has an opening portion 25 whose shape is substantially similar to the opening portion 16 of the first prepreg 14. The second prepreg 24 has an opening portion 26 whose shape is substantially similar to the opening portion 17 of the first prepreg 15. The position of the opening portion 25 of the second prepreg 23 is similar to the position of the opening portion 16 of the first prepreg 14. Similarly, the position of the opening portion 26 of the second prepreg 24 is similar to the position of the opening portion 17 of the first prepreg 15.

On the side of the second prepreg 23 opposite to the first prepreg 14, a rigid board 33 having plural conductive layers 31, 32 in which conductive circuits are formed is provided. Similarly, on the side of the second prepreg 24 opposite to the first prepreg 15, a rigid board 36 having plural conductive layers 34, 35 in which conductive circuits are formed is provided. The rigid boards 33, 36 have opening portions 37, 38 whose shape are substantially similar to the opening portions 16, 17, 25, 26 of the prepregs 14, 15, 23, 24. The position of the opening portions 37, 38 are similar to the position of the opening portions 16, 17, 25, 26. Furthermore, it is possible to provide conductive circuits (copper foil) directly on the second prepregs 23, 24, in stead of using the rigid boards 33, 36.

Although in FIG. 2, the rigid boards 33, 36 look separated from the second prepregs 23, 24, in practice, the rigid boards are attached to the prepregs 23, 24, in actual printed wiring boards. With regard to the thickness of the combined laminated layers made from the basefilm 10, the prepregs 14, 15, 23, 24 and the cover lays 21, 22, the combined thickness of the opening portions 25, 26 is larger than the combined thickness of only the basefilm 10 and the cover lays 21, 22 at the flexible portion defined by openings 25, 26. The surface of all the laminated layers is uneven, however, how uneven the surface is actually does not matter.

A window portion 41 is formed by overlapping the opening portions 16, 17, 25, 26, 37, 38. The layer constituted by the basefilm 10 and the cover lays 21, 22 has flexibility. A flexible portion is formed by removing the edges 44, 45 of the window portion 41. The printed wiring board can be bent at the flexible portion. To the contrary, the other portions have very little flexibility. The other portions are the so-called rigid portions. At predetermined portions of the rigid portions, through-holes 42, 43 are cut through, which pierce and extend from one surface of the printed wiring board to the other surface. Although in the present embodiment, the cover lays 21, 22 extend to the portion of the through-holes 42, 43, the cover lays need not extend to the through-holes.

The printed wiring board is manufactured as described below.

First, the first prepregs 14, 15 are placed on both sides of the basefilm 10 having conductive circuits, and then the opening portions 16, 17 are covered with a single semirigid bonding sheet made from polyimide-containing resin material. The bonding sheet should be placed so as to completely cover the opening portions 16, 17. Next, after they are thermocompressed and bonded at a predetermined pressure and temperature, the bonding sheets are cured to become the cover lays 21, 22. Namely, the first printed wiring board, in which the basefilm 10, the first prepregs 14, 15, and the cover lays 21, 22 are laminated, is obtained.

Next, the second prepreg 23 and the rigid board 33 are placed onto the surface of the first prepreg 14 in such a way that the opening portions 16, 25, 37 are placed to overlap each other. The second prepreg 24 and the rigid board 36 are placed on the surface of the first prepreg 15 in such a way that the opening portions 17, 26, 38 are placed to overlap each other. After they are heated with compression in the thickness direction, they are joined to become one object. Next, after making holes at predetermined portions, the almost complete printed wiring board is plated, and thus through-holes 42, 43 are made. The printed wiring board which has the layers described in FIG. 2 can be thus obtained after the above mentioned steps.

As described above, the cover lays 21, 22 of the printed wiring board according to the present invention, which cover the window portion 41, are formed by curing a semirigid bonding sheet made from polyimide-containing resin material. The adhesion of the cover lays 21, 22 is so strong that they never separate from the basefilm 10 during manufacturing of the printed wiring board.

When the cover lays 21, 22 of the present invention are adhered on the basefilm 10, adhesive made from epoxy resin, which is used in the prior art, is not used. Accordingly, even if the cover lays 21, 22 extend to the portions of the through-holes 42, 43, there is no possibility that smear occurs in a process in which the through-holes 42, 43 are formed with a drill. Accordingly, in the embodiment, copper plating layers having few irregularities are formed on the inside wall surface of the through-holes 42, 43. And any portions between conductive circuits on the basefilm 10 and copper plating, whose electric splice is weak, are not created. And the mechanical joint between them also is strong.

As described above, in the embodiment, even if the cover lays 21, 22 extend to the portions of the through-holes 42, 43, there is no possibility that smear occurs in the through-holes 42, 43. Accordingly, in the process in which the semirigid bonding sheet made from polyimide-containing resin material is placed on the opening portions 16, 17 to form the cover lays 21, 22, it is not necessary to place the bonding sheet accurately on the opening portions 16, 17. The cover lays may extend to the portions at which the through-holes 42, 43 are formed. Accordingly, it is very easy to produce the printed wiring board of this embodiment.

Figure 3:
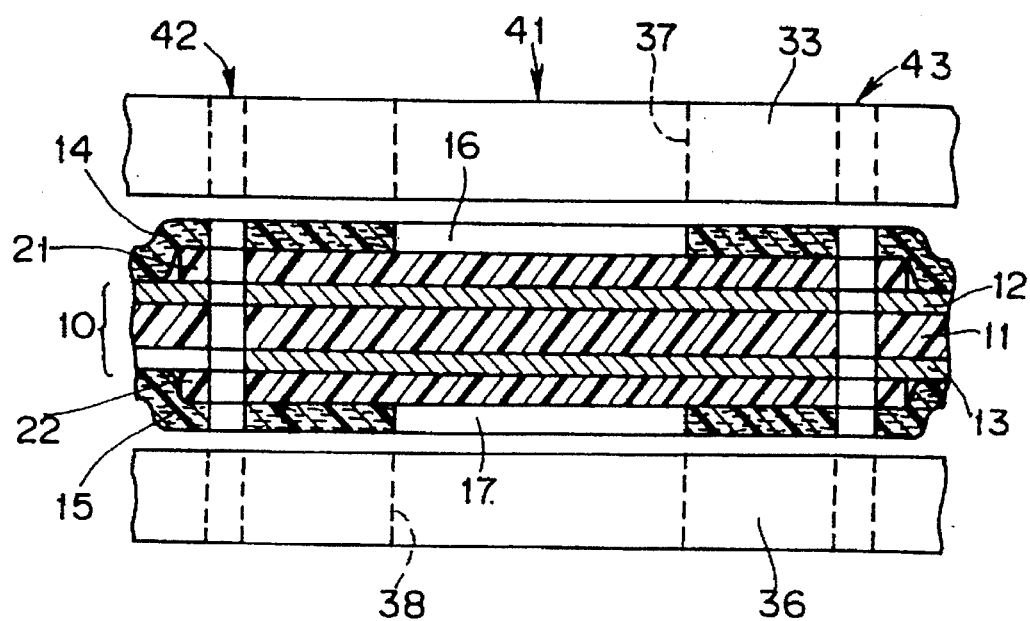
FIG. 3 is a sectional view showing a structure of laminated layers of a printed wiring board according to a second embodiment.

FIG. 3 describes the printed wiring board of the second embodiment.

In the second embodiment, the cover lays 21, 22 are placed directly onto predetermined portions of both surfaces of the basefilm 10. The first prepreg 14 is laminated on the basefilm 10 in such a way that the opening portion 16 overlaps the cover lay 21.

Namely, compared with the first embodiment, in the second embodiment, the upper and lower positions between the cover lays 21, 22 and the first prepregs 14, 15 are reversed in the second embodiment. Further, the second embodiment differs from the first embodiment on the point that the rigid boards 33, 36 are directly placed on the surfaces of the first prepregs 14, 15. The other structures of the second embodiment are similar to the first embodiment. In the second embodiment also, conductive circuits (copper foil) may be directly placed onto the first prepregs 14, 15 in spite of the rigid boards 33, 36. Further, the cover lays 21, 22 extend to the portion of the through-holes 42, 43, however, the cover lays need not reach the through-holes.

In the second embodiment, the advantageous effects similar to the first embodiment can be obtained.

Further, the layer structure of conductive circuits has no limitation in the present invention, though in the above embodiments, conductive circuits are constructed as 4 layers or 6 layers.

Figure 4:
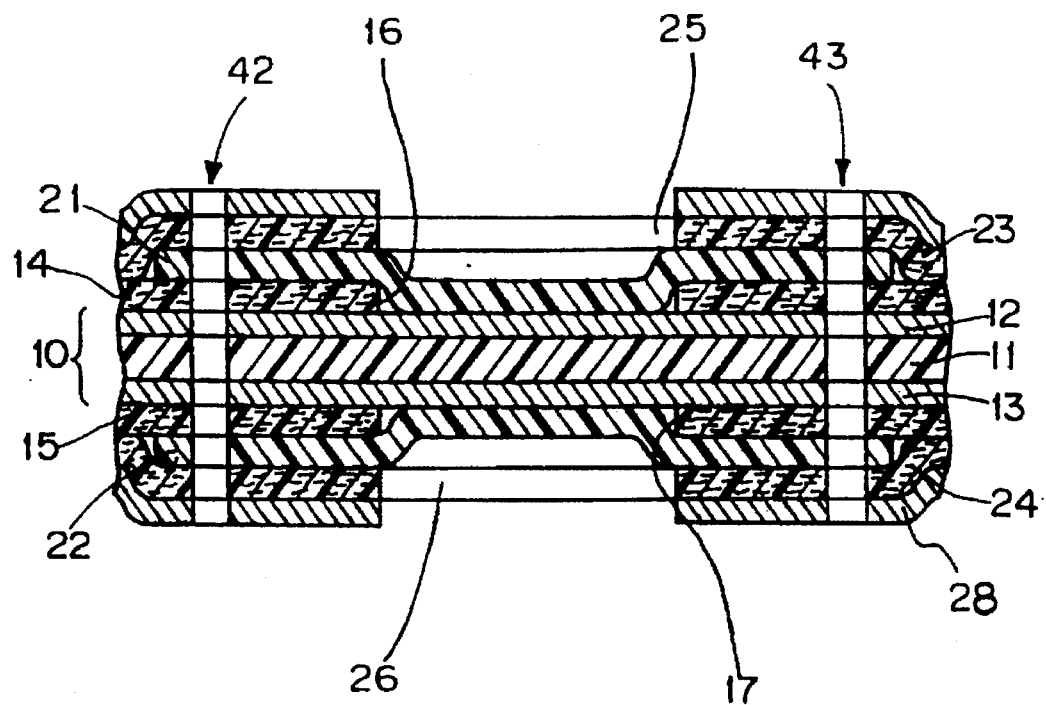
FIG. 4 is a sectional view showing a structure of laminated layers of a printed wiring board according to a third embodiment.

FIG. 4 describes the printed wiring board of the third embodiment.

In the third embodiment, conductive circuits 27, 28 (formed in the copper foil sheets) are provided directly on the second prepregs 23, 24, in stead of using the rigid board. The structure of the other layers are similar to the first embodiment.

Figure 5:
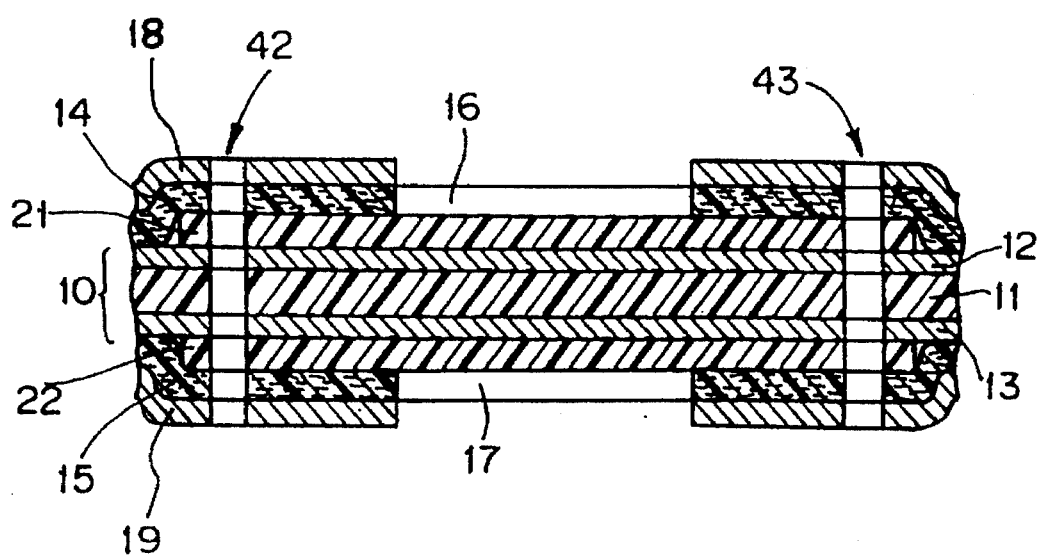
FIG. 5 is a sectional view showing a structure of laminated layers of a printed wiring board according to a fourth embodiment.

FIG. 5 describes the printed wiring board of the fourth embodiment.

In the fourth embodiment, conductive circuits 18, 19 (formed in the copper foil sheets) are provided directly onto the first prepreg 14, 15, in stead of using the rigid board. The structure of the other layers are similar to the second embodiment.

As described above, the present invention offers the effect that the cover lay is not removed from the surface of the flex portion.

Although the embodiments of the present invention have been described herein with reference to the accompanying drawings, obviously many modifications and changes may be made by those skilled in this art without departing from the scope of the invention.

We claim:

1. A printed wiring board comprising:

a basefilm having at least one conductive circuit formed thereon;

a cover lay laminated onto said basefilm in such a way that a single layer sheet of semirigid polyimide-containing resin material is placed on a surface of said basefilm, where said conductive circuit is provided, and is thermocompressed bonded thereto.

2. A printed wiring board comprising:

a basefilm having at least one conductive circuit;

a first prepreg having an opening portion laminated onto said basefilm;

a cover lay laminated onto said basefilm in such a way that a single layer sheet of semirigid polyimide-containing resin material is placed on said first prepreg in a manner in which said opening portion is overlapped, and thermocompressed to be bonded;

a second prepreg having an opening portion whose shape is substantially similar to said opening portion of said first prepreg, which is laminated onto said first prepreg in a manner in which said opening portion of said first prepreg and said second prepreg overlap each other.

3. A printed wiring board according to claim 2, wherein a surface of said second prepreg is provided with a plurality of conductive circuits.

4. A printed wiring board according to claim 2, wherein a surface of said second prepreg is provided with a rigid board which has a plurality of conductive layers on which conductive circuits are formed.

5. A printed wiring board comprising:

a basefilm having at least one conductive circuit;

a cover lay laminated on said basefilm in such a way that a single layer sheet of semirigid polyimide-containing resin material is placed onto a surface of said basefilm, where said conductive circuit is provided, and is thermocompressed to be bonded; and, a first prepreg having an opening portion smaller than said cover lay, which is laminated onto said basefilm whereby said opening portion is overlapped by said cover lay.

6. A printed wiring board according to claim 5, wherein a conductive circuit is provided on a surface of said first prepreg.

7. A printed wiring board according to claim 5, wherein a rigid board having a plurality of conductive layers on which conductive circuits are formed, which is laminated onto a surface of said first prepreg.

8. A printed wiring board according to claim 2 or claim 5, wherein said single layer sheet is made from semirigid polyimide-containing resin material.

9. A printed wiring board according to claim 2 or claim 5, wherein said first prepreg is laminated on both sides of said basefilm.

10. A printed wiring board according to claim 2 or claim 5, wherein said cover lay is laminated on both sides of said basefilm.

11. A printed wiring board according to claim 2, wherein said second prepreg is laminated onto said first prepreg which is laminated onto both sides of said basefilm.

* * * * *